United States Patent
Handa et al.

(10) Patent No.: US 7,404,751 B2
(45) Date of Patent: Jul. 29, 2008

(54) METHOD OF MANUFACTURING A LIGHT EMITTING DISPLAY PANEL AND A LIGHT EMITTING DISPLAY PANEL

(75) Inventors: Shinichi Handa, Tokyo-To (JP); Hirofumi Nakajima, Tokyo-To (JP); Kenichi Kuba, Tokyo-To (JP); Hiroyuki Shirogane, Tokyo-To (JP); Masaru Kobayashi, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 79 days.

(21) Appl. No.: 10/662,805

(22) Filed: Sep. 16, 2003

(65) Prior Publication Data

US 2004/0135503 A1    Jul. 15, 2004

(30) Foreign Application Priority Data

Sep. 17, 2002 (JP) ............................. 2002-270612
Sep. 17, 2002 (JP) ............................. 2002-270613

(51) Int. Cl.
*H05B 33/00* (2006.01)
*H01L 51/56* (2006.01)

(52) U.S. Cl. ........................... 445/24; 445/25; 156/230; 156/235

(58) Field of Classification Search ................ 445/24, 445/25; 313/411, 512; 156/239, 247, 230
See application file for complete search history.

(56) References Cited

U.S. PATENT DOCUMENTS 3,252,845 A * 5/1966 Schindler et al. ............ 156/247
5,482,896 A * 1/1996 Tang ............................ 438/28
5,656,823 A    8/1997 Kruangam ................... 257/59
5,856,030 A * 1/1999 Burrows ...................... 313/511
6,811,895 B2 * 11/2004 Murasko et al. ............. 313/506

FOREIGN PATENT DOCUMENTS

| DE | 19715054 |    | 10/1998 |
| EP | 1013413 A1 | * | 6/2000 |
| JP | 4367892 A |   | 12/1992 |
| JP | 9120889 A |   | 5/1997 |
| JP | 10-208878 |   | 8/1998 |
| JP | 2002-15859 |  | 1/2002 |
| WO | WO 9921708 A1 | * | 5/1999 |
| WO | WO 02/29493 |   | 4/2002 |

OTHER PUBLICATIONS

Usui, Hiroaki, "Deposition of Polymeric Thin Films by Ionization-Assisted Method", Proceedings of 1998 Int'l Symposium on Electrical Insulating Materials, Sep. 27-30, 1998, pp. 577-582.

* cited by examiner

*Primary Examiner*—Mariceli Santiago
(74) *Attorney, Agent, or Firm*—Oliff & Berridge, PLC

(57) ABSTRACT

The present invention is a method of manufacturing a light emitting display panel, which includes a laminated structure formed by laminating at least a flexible base layer, a first electrode layer, an EL layer, a second electrode layer and a flexible sealing layer in that order. The flexible base layer is provisionally attached to a rigid flat plate, and thereafter supplied to a main manufacturing step of the light emitting display panel. According to the feature, no significant unevenness in the thicknesses of layers formed on or above the flexible base layer is generated. Therefore, a light emitting display panel whose light emitting strength is uniform can be produced.

6 Claims, 5 Drawing Sheets

US 7,404,751 B2

METHOD OF MANUFACTURING A LIGHT EMITTING DISPLAY PANEL AND A LIGHT EMITTING DISPLAY PANEL

BACKGROUND OF THE INVENTION

1. Field of the Invention

The present invention relates to a method of manufacturing a light emitting display panel having an electroluminescent element (the term "electroluminescent" is hereinafter sometimes abbreviated as "EL"). In addition, the present invention relates to a light emitting display panel having an EL element.

2. Description of the Related Art

An EL element is excited to emit a light when an electric field is applied to a fluorescent compound therein. The EL element has a high visibility because of its self-emitting property. In addition, the EL element is excellent in shock resistance because it is a complete solid body. Especially, an organic EL element that includes an organic component as a fluorescent material has the following advantageous features. At first, the organic EL element has a high luminous efficiency, that is, a highly bright light is realized by an applied voltage as low as less than 10V. Then, the organic EL element can emit a light with a simple element structure. Further, the organic EL element has a long life duration. In addition, the organic EL element has a layered structure in which a hole-transporting layer, a luminescent layer and an electron-injecting layer are mainly formed between an anode and a cathode. Each layer can be formed to have a nanoscale thickness, which is advantageous in that a reduction of thickness and weight of the element can be facilitated. In addition, each layer can be manufactured by applying a coating liquid in which a polymer material is dissolved. Thus, when manufacturing the respective layers, a printing method to a paper and an ink jet method can be applied to the manufacturing step.

A light emitting display panel, in which an organic EL element having the various advantages described above is formed on or above a flexible substrate, has a flexibility as a whole. Therefore, such a light emitting display panel has been recently expected to be employed in an advertisement display (an electric spectaculars panel, for example) which emits a light to display a certain pattern, and a relatively inexpensive display which emits a light to display a simple sign. It has also been under review to apply such a light emitting display panel to various kinds of display panels such as a thin-film panel, a band-shaped panel, a circular panel, and so on (for example, please see Japanese Patent Laid-Open Publication No. 15859/2002 (claims and FIG. 1)).

In a conventional method of manufacturing a light emitting display panel, a glass substrate is generally used. Basically, such a manufacturing method includes the steps of: supplying a glass substrate; forming a transparent electrode, an EL layer, and so on; and discharging a manufactured light emitting display panel. Each handling between the steps is carried out by receiving the glass substrate in a cassette.

An invention of improvement for manufacturing a light emitting display panel is disclosed in Japanese Patent Laid-Open Publication No. 208878/1998 (claims and FIG. 1) in which a layered body, which has an EL layer therein and is separately formed, is laminated by a pair of carrier films so as to manufacture a light emitting display panel.

However, in a method of manufacturing a flexible light emitting display panel employing the above flexible substrate, when each layer is directly formed on the flexible substrate, there is a possibility that thicknesses of the respective layers (especially a thickness of the EL layer which influences ununiformity of a light emitting strength) become uneven because of a flexibility of the flexible substrate itself. In order to restrain the unevenness, a different step from that for the glass substrate is additionally needed, which may impair the productivity.

Regarding a light emitting display panel itself, in the market, a light emitting display panel is requested to be superior in a soliciting effect, i.e., a publicizing and advertising effect on soliciting purchasers to purchase things. For example, at first, a light emitting display panel is requested to be noticed by purchasers.

A light emitting display panel is also requested to be flexible enough to be freely attached on or incorporated in variously shaped objects. In addition, in order to be arranged in various environments, a light emitting display panel is requested to be hardly affected by factors of environment such as moisture (steam), oxygen, or the like. Furthermore, suppliers have been studying a structure design of a light emitting display panel that can be manufactured at a low cost.

SUMMARY OF THE INVENTION

The present invention is made to solve the above disadvantages, and an object thereof is to provide a method of manufacturing a light emitting display panel in which no significant unevenness of the thicknesses of layers is generated even when the layers are directly formed on a flexible substrate.

The present invention is a method of manufacturing a light emitting display panel including a laminated structure formed by laminating at least a flexible base layer, a first electrode layer, an EL layer, a second electrode layer and a flexible sealing layer in that order, wherein the flexible base layer is provisionally attached to a rigid flat plate, and thereafter supplied to a main manufacturing step of the light emitting display panel.

According to the feature, the flexible base layer is supplied to a main manufacturing step after the flexible base layer is provisionally attached to the rigid flat plate. Thus, no significant unevenness in the thicknesses of layers formed on or above the flexible base layer is generated. Therefore, a light emitting display panel whose light emitting strength is uniform can be produced.

For example, the EL layer is formed on or above the flexible substrate which has been already provisionally attached to the rigid flat plate.

Preferably, a provisional attachment of the flexible base layer to the rigid flat plate and a detachment of the flexible base layer from the rigid flat plate are carried out once or more in the course of manufacturing the light emitting display panel. For example, before a step or steps for forming a layer whose thickness has to be strictly controlled, the flexible base layer is provisionally attached to the rigid flat plate. Then, after the step or steps, the flexible base layer is detached from the rigid flat plate. Thus, a light emitting display panel whose display performance is good can be produced.

In addition, preferably, the flexible base layer is provisionally attached to the rigid flat plate by one or more means selected from a detachable sealing attachment, a bond attachment, an adhesive attachment, an attachment by tool, and a vacuum attachment.

For example, the rigid flat plate is a glass substrate.

In addition, the present invention is made to satisfy the above requests, and an object thereof is to provide a light emitting display panel that is superior in a soliciting effect, environmental resistance and flexibility and that can be manufactured at a low cost.

The present invention is a light emitting display panel including a laminated structure formed by laminating at least a flexible base layer, a first electrode layer, an EL layer, a second electrode layer and a flexible sealing layer in that order, wherein the laminated structure has an insulating layer that insulates the first electrode layer and the second electrode layer to each other, and the insulating layer is formed into a predetermined pattern.

According to the feature, since the EL layer is luminous very brightly, the light emitting display panel is superior in a soliciting effect. In addition, the laminated structure including the flexible base layer and the flexible sealing layer is superior in environmental resistance and flexibility. Furthermore, the laminated structure is suitable for being manufactured at a low cost.

For example, the insulating layer defines a light emitting region of a predetermined shape. That is, since the insulating layer formed in the laminated structure insulates the two electrodes to each other, the pattern of the insulating layer becomes a light non-emitting region, which defines a light emitting region.

In the case, the light emitting region may form a character, a figure, a mark or a display pattern formed by combining some of a character, a figure and a mark. Then, the character, the figure, the mark or the display pattern can be conspicuously shown by the light emitting display panel, because the EL layer is luminous very brightly.

Alternatively, a light non-emitting region other than the light emitting region may form a character, a figure, a mark or a display pattern formed by combining some of a character, a figure and a mark. In the case too, the character, the figure, the mark or the display pattern can be conspicuously shown by the light emitting display panel.

Preferably, the light emitting display panel has a thickness of 50 μm to 400 μm. In the case, the light emitting display panel is satisfactorily flexible and paper-like.

In addition, preferably, the flexible sealing layer consists of a sealing agent or a laminated structure formed by laminating a sealing agent and a flexible sealing base layer.

In addition, preferably, a barrier layer is provided between the flexible base layer and the first electrode layer, and another barrier layer is provided between the second electrode layer and the flexible sealing layer. These barrier layers enhance more the environmental resistance of the light emitting display panel.

In addition, preferably, the flexible base layer and the flexible sealing layer are optically transparent, and at least one of the first electrode layer and the second electrode layer is also optically transparent. In the case, the display pattern provided by the light emitting display panel can be seen from one side or from both sides. For example, at least one of the first electrode layer and the second electrode layer is formed of a transparent oxide film.

In addition, preferably, a partial laminated structure formed by at least the flexible base layer and the first electrode layer on a side with respect to the EL layer and another partial laminated structure formed by at least the second electrode layer and the flexible sealing layer on the other side with respect to the EL layer have substantially the same expansion coefficient. In the case, since the opposite partial laminated structures with respect to the EL layer have substantially the same expansion coefficient, the light emitting display panel may be hardly deformed even when it is subjected to heat or another outer factor.

In addition, preferably, the first electrode layer, the EL layer, the second electrode layer and the insulating layer are formed on or above the flexible base layer by means of a wet process, which can be carried out at a low cost. In the case, the said respective layers can be formed by the cheap wet process, the light emitting display panel can be manufactured and supplied to the market at a satisfactorily low cost.

In addition, the present invention is a light emitting display panel comprising a laminated structure, the laminated structure including: a first electrode layer; a second electrode layer; an EL layer between the first electrode layer and the second electrode layer; an insulating layer between the first electrode layer and the second electrode layer, the insulating layer being formed into a pattern and insulating the first electrode layer and the second electrode layer to each other; a flexible layer on a side with respect to the first electrode layer and the second electrode layer; and another flexible layer on the other side with respect to the first electrode layer and the second electrode layer.

Each layer can be formed by any known process. The laminated structure can be formed by any known method.

DESCRIPTION OF THE PREFERRED EMBODIMENTS (Method of Manufacturing a Light Emitting Display Panel)

Figure 1:
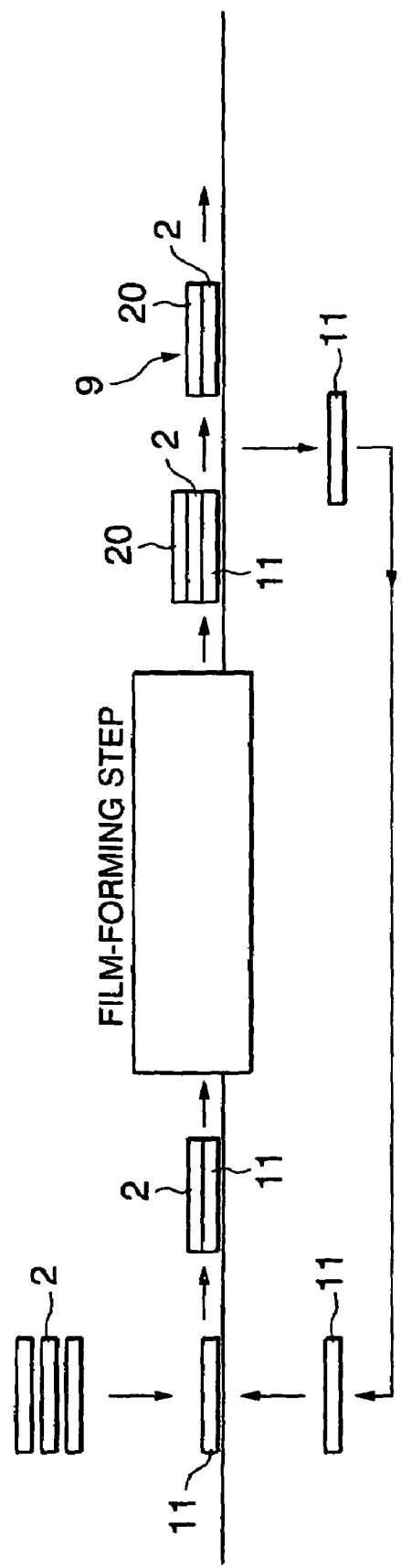
FIG. 1 is a view showing an example of partial steps in a method of manufacturing a light emitting display panel according to the present invention.
Figure 2:
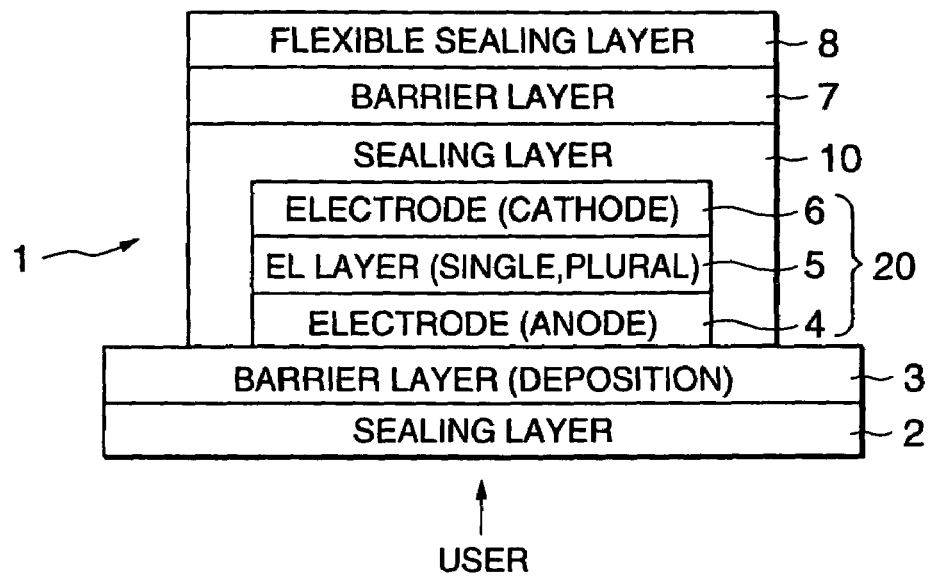
FIG. 2 is a cross-sectional view showing an example of a structure of a light emitting display panel manufactured by a method of manufacturing a light emitting display panel according to the present invention.

An embodiment of a method of manufacturing a light emitting display panel according to the present invention is hereinafter described in detail. FIG. 1 shows an example of partial steps in a method of manufacturing a light emitting display panel according to the present invention. FIG. 2 is a cross-sectional view showing an example of a structure of a light emitting display panel manufactured by a method of manufacturing a light emitting display panel according to the present invention.

As shown in FIGS. 1 and 2, a method of manufacturing a light emitting display panel according to the present invention is a method of manufacturing a light emitting display panel 9 including a layered body 1 having at least a flexible base layer 2, a first electrode layer 4, an EL layer 5, a second electrode layer 6, and a flexible sealing layer 8, which are superposed in that order. As shown in FIG. 1, a characteristic feature of the method is that the flexible base layer 2 is provisionally attached to a rigid flat plate 11, and thereafter supplied to a main manufacturing step of the light emitting display panel 9.

It is preferable that the rigid flat plate 11 has a surface smoothness of less than 1 μm, preferably less than 1 nm. Since such a rigid flat plate 11 has a favorable flatness, when the flexible base layer 2 is provisionally attached to the rigid flat plate 11, a flatness of the flexible base layer 2 becomes equivalent to that of rigid flat plate 11. As a result, thicknesses of layers to be formed on or above the flexible base layer 2 can be controlled within a predetermined range.

Glass, quartz, metal, plastics, stone, and so on can be given as concrete examples used for a material of the rigid flat plate 11 with the above feature. Among these substances, quartz glass or the like with a low thermal expansion coefficient is preferably used when a manufacturing step includes a heating process and an ultraviolet irradiating process. In addition, the quartz glass or the like has excellent corrosion resistance against an etching liquid and excellent endurance against a developer. Thus, the quartz glass or the like is preferably used when a manufacturing step includes such a process.

In general, a thickness of the rigid flat plate 11 is preferably in a range of from 0.5 mm to 5 mm, although it may be varied according to a kind of the material. The rigid flat plate 11 having a thickness within the range is advantageous in easy handling and easy acquisition. A size of the rigid flat plate 11 is not specifically limited, and can be optionally set according to a size of the light emitting display panel to be manufactured and/or a manufacturing apparatus therefor.

Preferably, the flexible base layer 2 is provisionally attached to the rigid flat plate 11 by one or more means selected from a sealing attachment, a bond attachment, an adhesive attachment, an attachment by tool, and a vacuum attachment. However, other means can be used for the provisional attachment. In any case, since the attachment is "provisional", it is important that such means detachably attaches the flexible base layer 2 to the rigid flat plate 11.

The bond attachment and the adhesive attachment are carried out by applying a bond or adhesive of UV curing type, two-pack curing type, urethane-based type, or acryl-based type onto a surface of a rigid flat plate, and affixing thereto a flexible base layer. An adhesive strength is preferably not so large (for example, not more than 500 gf (4.9 N)/inch) in order that the flexible base layer and the rigid flat plate are detachable from each other.

Alternatively, in place of applying a bond or adhesive directly to the rigid flat plate 11, a sheet may be prepared, which has one surface applied by a high strength bond (adhesive) and the other surface applied by a low strength bond (adhesive), then the rigid flat plate 11 may be affixed to the high strength bond (adhesive), and a flexible base layer may be affixed to the low strength bond (adhesive).

The sealing attachment is carried out by affixing a sheet having a good adhesiveness, such as a silicone rubber sheet, to the rigid flat plate 11 by means of a laminating roller or the like, and affixing a flexible base layer thereto by means of a laminating roller or the like. A strength of the rubber is preferably in a range of 10° to 70° (JIS-A).

Figure 3:
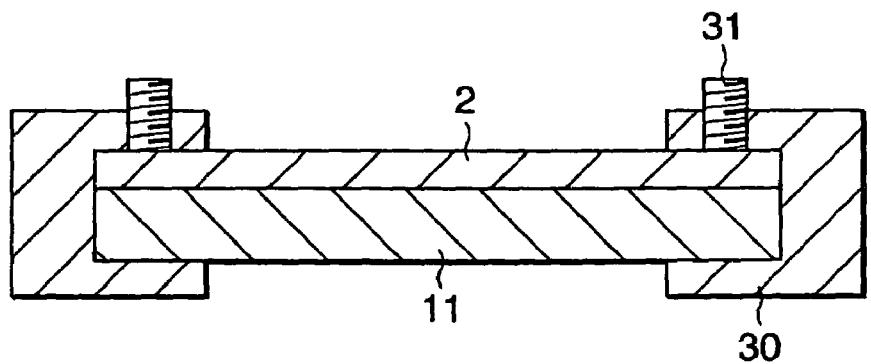
FIG. 3 is a cross-sectional view showing an example of a flexible substrate and a rigid flat plate which are provisionally attached to each other by a fixing tool.

FIG. 3 shows an example of the attachment by tool in which an upper surface, a lower surface and a lateral surface of the rigid flat plate 11 can be provisionally held by means of a fixing tool 30. The attachment by tool is carried out by mounting the fixing tool 30 on lateral surfaces of the flexible base layer 2 and the rigid flat plate 11 which have been affixed to each other. An attachment and detachment of the fixing tool 30 is carried out by a screw 31 or the like.

The rigid flat plate 11 to which the flexible base layer 2 has been provisionally attached is supplied to a main manufacturing step of a light emitting display panel. A step to which the rigid flat plate 11 is supplied is not specifically limited. The rigid flat plate 11 in the provisionally attached state may be supplied to all the steps, and at last, the rigid flat plate 11 may be detached from a light emitting display panel formed thereon. In this case, the number of times of the provisional attachment of the flexible material 2 to the rigid flat plate 11 is one. The number of times of the detachment thereof is also one.

Alternatively, a provisional attachment of the flexible base layer 2 to the rigid flat plate 11 may be selected for every film forming step. For example, the flexible base layer 2 is provisionally attached to the rigid flat plate 11 before an anode layer forming step, and is detached therefrom after the anode layer forming step. In addition, the flexible base layer 2 is provisionally attached to the rigid flat plate 11 before an EL layer forming step, and is detached therefrom after the EL layer forming step. In this case, the number of times of the provisional attachment of the flexible base layer 2 to the rigid flat plate 11 is two. The number of times of the detachment thereof is also two.

In the present invention, the expression "a flexible base layer is provisionally attached to a rigid flat plate" means that the two members are provisionally attached with a surface of the flexible base layer on a side of the rigid flat plate being opposed to a surface of the rigid flat plate. Thus, as shown in FIG. 2, a state in which a plurality of layers are present on the flexible base layer 2 is included in the present invention. Accordingly, there may be cases wherein only the flexible base layer is provisionally attached to the rigid flat plate, and wherein after forming a plurality of layers on the flexible base layer, a surface of the flexible base layer on a side of the rigid flat plate and a surface of the rigid flat plate are provisionally attached to each other, in the course of manufacturing a light emitting display panel.

As described above, according to a method of manufacturing a light emitting display panel of the present invention, since thicknesses of respective layers formed on or above a flexible base layer are prevented from being uneven, a flexible light emitting display panel with a high quality and a uniform emission strength can be provided. Further, such a light emitting display panel can be easily manufactured by means of steps similar to those for manufacturing a glass substrate.

A concrete structure of a light emitting display panel is described below with reference to FIG. 2. Barrier layers 3 and 7 in FIG. 2 are preferably provided in order to improve a barrier property.

(Flexible Base Layer 2)

The flexible base layer 2 is provisionally attached to the rigid flat plate 11, and then detached from the rigid flat plate 11, in the manufacturing method according to the present invention. After the light emitting display panel is completed, the flexible base layer 2 is arranged on a side of users.

Thus, the flexible base layer 2 has to be easy to be provisionally attached and then detached. In addition, the flexible base layer 2 has to be transparent as much as the users can easily recognize a character, a figure, a mark or a display pattern formed by combining some of a character, a figure and a mark, which is formed by luminescence of an EL layer 5.

The flexible base layer 2 is a resin film or a sheet formed by applying a protective plastic sheet or a protective plastic layer to a thin sheet glass of a thickness not greater than about 100

μm. The flexible base layer 2, which is highly flexible and can be rolled and curved, is a preferable base layer for a light emitting display panel to be attached to or incorporated in various objects.

There is no particular restriction on the material of the flexible base layer 2, provided that the flexible base layer 2 has a sufficient flexibility required of a base layer for a light emitting display panel. More concretely, materials suitable for forming the flexible base layer 2 include, fluorine resins, polyethylene resins, polypropylene resins, polyvinyl chloride resins, polyvinyl fluoride resins, polystyrene resins, ABS resins, polyamide resins, polyacetal resins, polyester resins, polycarbonate resins, modified poly(phenylene ether) resins, polysulfone resins, polyarylate resins, poly(ether imide) resins, polyamidimde resins, polyimide resins, polyphenylene sulfide resins, liquid crystalline polyester resins, polyethylene terephthalate resins, polybutylene terephthalate resins, polyethylene naphthalate resins, polyoxymethylene resins, poly(ether sulphone) resins, poly(ether ether ketone) resins, polyacrylate resins, polyacrylonitrile-styrene resins, phenolic resins, urea resins, melamine resins, unsaturated polyester resins, epoxy resins, polyurethane resins, silicone resins and amorphous polyolefin resins.

The flexible base layer 2 may be formed of any suitable polymer, other than the foregoing resins, meeting conditions required of materials for forming a light emitting display panel. The flexible base layer 2 may be formed of a copolymer produced through copolymerization of some of the starting materials, i.e. monomers, of the foregoing resigns.

More preferably, the flexible base layer 2 is formed of a resin satisfactory in solvent resistance and heat resistance and, if the purpose requires, having a gas-barrier property capable of preventing penetration of steam and oxygen gas. When a resin material having the gas-barrier property is used, a barrier layer 3, which will be described later, may be omitted. However, it is preferable that a light emitting display panel is provided with both the flexible base layer 2 and the barrier layer 3. Preferably, the flexible base layer 2 is formed by an extrusion process or the like into a film of a thickness in the range of 50 to 400 μm.

A sheet, as the flexible base layer 2, formed by applying a protective plastic sheet or a protective plastic layer to a thin sheet glass of a thickness not greater than about 100 μm is excellent in flexibility, can be rolled or curved, and hence is a preferable flexible base layer 2. Preferably, the protective plastic sheet or the protective plastic layer has a satisfactory gas-barrier property.

When the flexible base layer 2 has a thickness in the above range, the flexible base layer 2 can provide a suitable flexibility for a light emitting display panel. Such a flexible light emitting display panel can be arranged with a complicated shape.

In addition, the light emitting display panel can be made as thin as 100 μm to 300 μm. Thus, the light emitting display panel can be used as a display element for a portable apparatus. In addition, the light emitting display panel can be used for an advertisement medium that can be freely rolled and/or curved.

(Barrier Layer 3)

The barrier layer 3 is not an essential layer in a light emitting display panel. Respective layers can be formed on or above the flexible base layer 2 provisionally attached on the rigid flat plate 11. However, it is preferable to sandwich the barrier layer 3 between the flexible base layer 2 and the first electrode layer 4. The barrier layer 3 prevents penetration of moisture (steam) and oxygen gas, which affects adversely to the life and luminescent ability of the organic EL layer 5, into the organic EL layer 5. The barrier layer 3, similarly to the flexible base layer 2, must be transparent.

Preferably, the barrier layer 3 is an inorganic oxide thin film. Inorganic oxides suitable for forming the barrier layer 3 include, for example, silicon dioxide, aluminum oxide, titanium oxide, yttrium oxide, germanium oxide, zinc oxide, magnesium oxide, calcium oxide, boron oxide, strontium oxide, barium oxide, lead oxide, zirconium oxide, sodium oxide, lithium oxide and potassium oxide. The barrier layer 3 may be formed of one or some of those oxides. Silicon dioxide, aluminum oxide and titanium oxide are particularly preferable materials for forming the barrier layer 3. The barrier layer 3 may be also formed of a material other than an inorganic oxide, such as silicon nitride. Preferably, the thickness of the barrier layer 3 is in the range of 0.01 to 0.5 μm.

The barrier layer 3 is formed between the flexible base layer 2 and the first electrode layer 4, for example, on the flexible base layer 2 by a physical vapor deposition process, such as a sputtering process. The barrier layer 3 can be formed by a physical deposition system that conveys the film-like flexible base layer 2 according to a roll-to-roll method.

(First and Second Electrode Layers 4, 6)

The first electrode layer 4 and the second electrode layer 6 are essential layers to apply an electric field to the EL layer 5. The first electrode layer 4 and the second electrode layer 6 may be formed both when the flexible base layer 2 is provisionally attached to the rigid flat plate 11 and when the flexible base layer 2 is detached from the rigid flat plate 11. In a manufactured light emitting display panel, the first electrode layer 4 is on the side of the flexible layer 2 with respect to the EL layer 5, and the second electrode layer 6 is on the side of the flexible sealing layer 8 with respect to the EL layer 5. At least the first electrode layer 4 facing the users (observers), similarly to the flexible base layer 2 and the barrier layer 3, must be transparent. The second electrode layer 6 does not necessarily need to be transparent. However, the second electrode layer 6 also needs to be transparent if a display pattern such as a character should be seen on the opposite back side too.

Suitable materials for forming the first electrode layer 4 include, for example, indium tin oxide (ITO), indium oxide, indium zinc oxide (IZO), gold and polyaniline. Indium tin oxide and indium zinc oxide, which are transparent oxides, are particularly preferable.

Suitable materials for forming the second electrode layer 6 include, in addition to indium tin oxide (ITO), indium oxide, indium zinc oxide (IZO), gold and polyaniline, magnesium alloys, such as Mg/Ag alloys, aluminum alloys, such as Al/Li alloys, Al/Ca alloys and Al/Mg alloys, and metallic calcium.

Any one of the first electrode layer 4 and the second electrode layer 6 may be an anode layer or a cathode layer. However, if one electrode layer is formed as an anode layer, the electrode layer is preferably formed of an electrical conductive material whose work function is large (for example, indium tin oxide (ITO)), in order to facilitate hole-injection. On the other hand, if one electrode layer is formed as a cathode layer, the electrode layer is preferably formed of an electrical conductive material whose work function is small (for example, metallic calcium), in order to facilitate electron-injection.

Preferably, the respective thicknesses of the first electrode layer 4 and the second electrode layer 6 are 50 nm to 200 nm. Usually, the first electrode layer 4 and the second electrode layer 6 are formed contiguously with the EL layer 5 by a sputtering process or a vacuum evaporation process. When the barrier layers 3 and 7 are provided on the flexible base layer 2 and the flexible sealing layer 8, the first electrode layer 4 and the second electrode layer 6 are formed between the barrier layers 3 and 7 and the EL layer 5.

The first electrode layer 4 and the second electrode layer 6 may be either solid layers or patterned layers pattered so as to correspond to the EL layer 5. A patterned electrode layer is formed by subjecting a solid electrode layer to an etching process using a photoresist mask.

(EL Layer 5)

The EL layer 5 is indispensable in a light emitting display panel. The EL layer 5 is formed above the flexible base layer 2 when the flexible base layer 2 is provisionally attached to the rigid flat plate 11.

The EL layer 5 may be of generally known construction. For example, the EL layer 5 may be: an organic luminescent layer containing an organic luminescent substance, such as an organic fluorescent substance, and being formed between electrode layers; a layered structure consisting of an organic luminescent layer, a hole-transporting layer of a hole-transporting material formed on a surface of the organic luminescent layer on the side of an anode, and an electron-transporting layer of an electron-transporting material formed on the other surface of the organic luminescent layer on the side of a cathode; a layered structure consisting of an organic luminescent layer having the property of a hole-transporting layer, and an electron-transporting layer formed on a surface of the organic luminescent layer on the side of a cathode; or a layered structure consisting of an organic luminescent layer having the property of an electron-transporting layer, and a hole-transporting layer formed on a surface of the organic luminescent layer on the side of anode.

In addition, the EL layer 5 may be: a layered structure consisting of a mixed layer of a hole-transporting material and an organic luminescent substance, which has been formed at least by mixing a hole-transporting material and an organic luminescent substance, and an electron-transporting layer; a layered structure consisting of a mixed layer of an organic luminescent substance and an electron-transporting material, which has been formed at least by mixing an organic luminescent substance and an electron-transporting material, and a hole-transporting layer; or a mixed layer of a hole-transporting material, an organic luminescent substance and an electron-transporting material.

The organic luminescent layer containing an organic luminescent substance may be formed of an azo compound generally used for forming an organic EL layer. The organic luminescent layer may be also formed of an azo compound containing an organic luminescent substance. Suitable organic luminescent substances include pyrene, anthracene, naphthacene, phenanthrene, coronene, chrysene, fluorene, perylene, perynone, diphenylbutadiene, coumarin, styryl, pyrazine, aminoquinoline, imine, diphenylethylene, merocyanine, quinacridone, rubrene and derivatives of those substances. An organic luminescent layer is formed by using an organic luminescent layer forming liquid containing such a compound.

The hole-transporting material may be chosen from generally used hole-transporting materials including phthalocyanine, naphthalocyanine, polyphylene, oxadiazole, triphenylamine, triazole, imidazole, imidazolone, tetrahydroimiazole, hydrazone, stilbene, butadiene and derivatives of those substances. The hole-transporting material may be a hole-transporting layer forming composition on the market, such as poly(3, 4)ethylene dioxithiophene/polystyrenesulfonate (abbreviated to PEDOT/PSS), such as Baytron P AI4083 commercially available in an aqueous solution from Bayer. The hole-transporting layer is formed by using a hole-transporting layer forming liquid containing such a compound.

Suitable electron-transporting materials include anthraquinodimethane, fluorenylidenemethane, tetracyanoethylene, fluorenone, diphenoquinone oxadiazole, anthrone, thiopyran dioxide, diphenoquinone, benzoquinone, malononitrile, dinitrobenzene, nitroanthraquinone, maleic anhydride, perylene tetracarboxylic acid and derivatives of those substances. The electron-transporting layer is formed by using an electron-transporting layer forming liquid containing such a substance.

The EL layer may be formed, according to the above-mentioned layered structure forming mode, by pouring an organic luminescent layer forming liquid, a hole-transporting layer forming liquid and an electron-transporting layer forming liquid in predetermined spaces demarcated by partition walls. Those liquids may be poured by a dispenser process using a dispenser for dropping a liquid, an ink-jet process, a spin-coating process or a printing process. The ink-jet process is particularly preferable for printing a pattern because: the ink-jet process is able to apply the liquid to a base without touching and damaging the base; does not need any printing plate; and hence has a high degree of freedom. The productivity of forming the EL layer can be more improved by forming that by one of those printing processes. The poured liquids are subjected to a heat treatment, such as a vacuum heat treatment. Preferably, the thickness of the EL layer 5 in the above-mentioned layered structures is in the range of 0.1 to 2.5 μm.

Especially, in the manufacturing method of the present invention, the El layer is formed under the state wherein the flexible base layer 2 is provisionally attached to the rigid flat plate 11. Thus, unevenness of the thickness of the EL layer 5 can be controlled within the same range as that of the rigid flat plate 11, so that ununiformity of luminous efficiency can be reduced.

The partition walls, not shown, demarcate regions that become luminous in different colors on the surface of the light emitting display panel. A hole-transporting layer forming liquid, an organic luminescent layer forming liquid, and an electron-transporting layer forming liquid are respectively poured into the regions demarcated by the partition walls, according to the above-mentioned layered structure forming mode. The partition walls may be formed of a generally used partition wall forming material, such as a photopolymer, a curable resin that can be cured by radiation having activation energy, a thermosetting resin or a thermoplastic resin. The partition walls may be formed by a method suitable for forming the partition walls with a selected material. For example, the partition walls may be formed by a thick-film printing process or a patterning process using a photoresist mask.

(Sealing Layer 10)

The sealing layer 10 is a flexible sealing layer. The sealing layer 10 is formed of a generally used sealing material. Preferably, the sealing layer 10 is formed of a thermosetting epoxy adhesive or a UV-curable acrylic adhesive.

The sealing layer 10 may be directly formed on the organic EL element 20 so as to entirely coat a surface of the organic EL element 20, or may be formed on or above the flexible sealing layer 8 and then attached to the organic EL element 20. Preferably, the sealing layer 10 is formed in the least possible thickness provided that the sealing layer 10 is able to fill and seal gaps. The thickness of the sealing layer 10 may properly be adjusted. The sealing layer 10 is hardened under thermosetting or curing conditions depending on the material of the sealing layer 10.

Preferably, the sealing layer 10 entirely coats the surface of the EL element. A light emitting display panel provided with the sealing layer coating the entire surface of the EL element does not have any gaps therein. Therefore, the light emitting display panel will not be unnecessarily strained and tensioned even when rolled or curved, and hence troubles including abnormal contact in the EL element can be suppressed.

(Barrier Layer 7)

The barrier layer 7 is not essential. The barrier layer 7 may be formed both when the flexible base layer 2 is provisionally attached to the rigid flat plate 11 and when the flexible base layer 2 is detached from the rigid flat plate 11. Preferably, as shown in FIGS. 1 and 2, the barrier layer 7 is formed on the side of the EL layer 5 with respect to the flexible sealing layer 8. The barrier layer 7 is formed between the flexible sealing layer 8 and the second electrode layer 6, more concretely, between the flexible sealing layer 8 and the sealing layer 10. The operation and effect of the barrier layer 7 are the same as those of the barrier layer 3. Although there is no particular restriction on the material of the barrier layer 7, it is preferable to form the barrier layers 3 and 7 of the same material.

The barrier layer 7 is formed on the flexible sealing layer 8 by a physical deposition process, such as a reactive sputtering process or a vacuum deposition process.

(Flexible Sealing Layer 8)

As shown in FIG. 2, the flexible sealing layer 8 is a posterior layer opposite the anterior layer facing the users. When the light emitting display panel is to be seen only on the anterior side, the flexible sealing layer 8 does not need to be transparent. However, when the light emitting display panel is to be seen on both sides, it is preferable that the flexible sealing layer 8 is transparent. If the flexible sealing layer 8 is transparent, the users can visually recognize a display pattern such as a character on the back side too. If the posterior layers are transparent, the anterior layers don't need to be transparent. In such a case, the posterior side functions as a user's side.

The flexible sealing layer 8 is a flexible resin film capable of being rolled or curved. Therefore, the flexible sealing layer 8 is preferably used as a base layer for a light emitting display panel that can be attached to various structures. The material of the flexible sealing layer 8 and the method for forming the same are the same as those mentioned in connection with the flexible base layer 2, and hence the description thereof will be omitted. Preferably, the thickness of the flexible sealing layer 8, similarly to that of the flexible base layer 2, is in the range of 50 to 400 µm. The flexible sealing layer 8 of such a thickness has a flexibility suitable for the light emitting display panel.

(Light Emitting Display Panel)

Although the basic layered structure of the light emitting display panel obtained by the manufacturing method according to the present invention has been described, the light emitting display panel may be provided with additional functional layers other than those mentioned above, provided that the additional functional layers do not affect adversely to the essential functions of the light emitting display panel. For example, an additional functional layer is an insulating layer that blocks the voltage applied between the electrode layers to define a specific light non-emitting region.

Preferably, the respective thicknesses of the component layers of the light emitting display panel are selectively determined such that the thickness of the light emitting display panel is 50 µm to 800 µm. The light emitting display panel having a thickness in the range is flexible and can be rolled and curved, and hence the light emitting display panel can easily be mounted with a complicated shape, for example as an illumination panel.

In fabricating the light emitting display panel, the component layers of the light emitting display panel can continuously be formed by wet processes. Therefore, the light emitting display panel can be placed on the market at a reasonable price. For example, (1) the flexible base layer 2 provided with the barrier layer 3, and the flexible sealing layer 8 provided with the barrier layer 7 are formed by a continuous vapor deposition process, (2) the first electrode layer 4 is formed by a sputtering process on the barrier layer 3 formed on the flexible base layer 2, (3) the EL layer 5 is formed by printing process on the first electrode layer 4, (4) the second electrode layer 6 is formed by a vacuum evaporation process on the EL layer 5, (5) the sealing layer 10 is formed by applying a sealing agent to the second electrode layer 6, and (6) the flexible sealing layer 8 provided with the barrier layer 7 is bonded to the sealing layer 10. Thus, the light emitting display panel can be efficiently manufactured by using wet processes in many steps in accordance with a roll-to-roll continuous manufacturing method, which is superior in productivity.

EXAMPLE

An example of a manufacturing method of the light emitting display panel according to the present invention will be described.

A 100 µm thick flexible base layer 2 of a poly(ether sulphone) resin was formed by an extrusion process. A 0.1 µm thick barrier layer 3 of SiON was formed by a reactive sputtering system on the flexible base layer 2. A 0.1 µm thick anode layer of ITO was formed by a sputtering process on the barrier layer 3.

A glass substrate whose surface smoothness is not more than 1 nm was used as a rigid flat plate 11. A surface of the glass substrate was attached to a lower surface of the flexible base layer 2, on which the barrier layer and the electrode layer had been not formed. The attachment was carried out by a sealing attachment. Concretely, a silicone rubber having a hardness of 20 steps (JIS-A) and a thickness of 600 µm was used. The adhesive force was 100 gf (0.98 N)/inch.

The transparent electrode layer and an insulating layer were respectively patterned by photolithography above the flexible base layer 2. A 1.5 µm thick EL layer 5 of a mixture of a hole-transporting material and an organic luminescent material was formed by a printing process over the anode layer covered with the patterned insulating layer. After the EL layer 5 was formed, the rigid flat plate 11 being the glass substrate was detached from the lower surface of the flexible base layer 2. A cathode layer consisting of a 0.5 µm thick silver layer was formed by a vapor deposition process on the EL layer 5. An about 50 µm thick sealing layer of a two-part hardening epoxy adhesive was formed by a screen-printing process over the cathode layer. A flexible sealing layer provided with a barrier layer was bonded to the sealing layer. The flexible sealing layer provided with the barrier layer was formed by forming a 0.1 µm thick barrier layer of SiON by a continuous evaporation system on a 100 µm thick flexible sealing layer of a poly(ether sulphone) resin formed by an extrusion process.

Thus, the light emitting display panel as shown in FIG. 2 was fabricated by the fabricating method including those wet processes. The total thickness of the light emitting display panel was 250 μm.

As apparent from the foregoing description, according to the manufacturing method of the present invention, no significant unevenness in the thicknesses of layers formed on or above the flexible base layer is generated. Therefore, a light emitting display panel whose light emitting strength is uniform can be produced. Especially, since the thickness of the EL layer can be controlled within a range to reduce ununiformity of the luminescence efficiency, a light emitting display panel whose display performance is superior can be produced. In addition, the manufacturing method can advantageously use a conventional apparatus for manufacturing a glass substrate.

(Light Emitting Display Panel)

Figure 4:
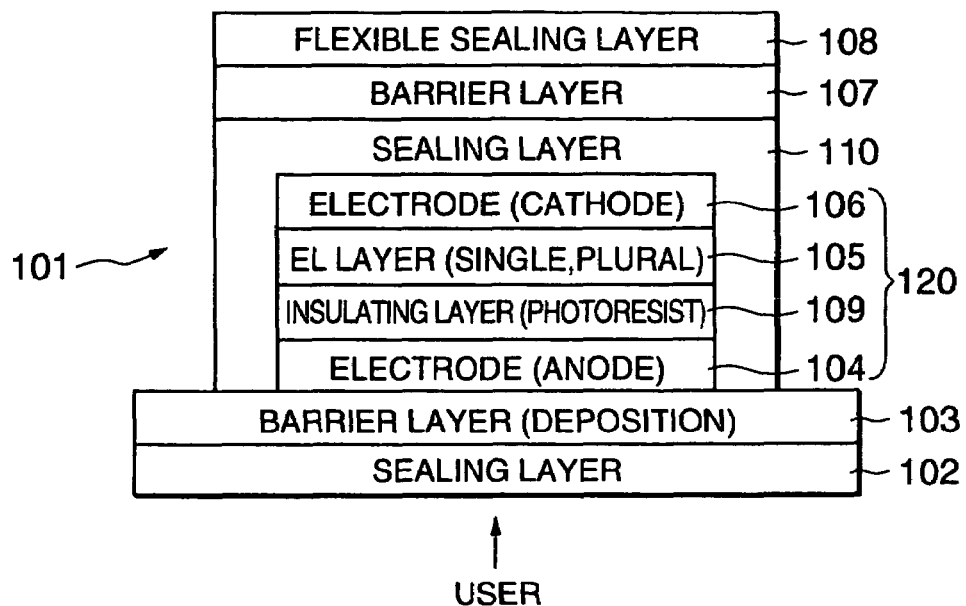
FIG. 4 is a cross-sectional view showing an example of a structure of a light emitting display panel according to the present invention.
Figure 5:
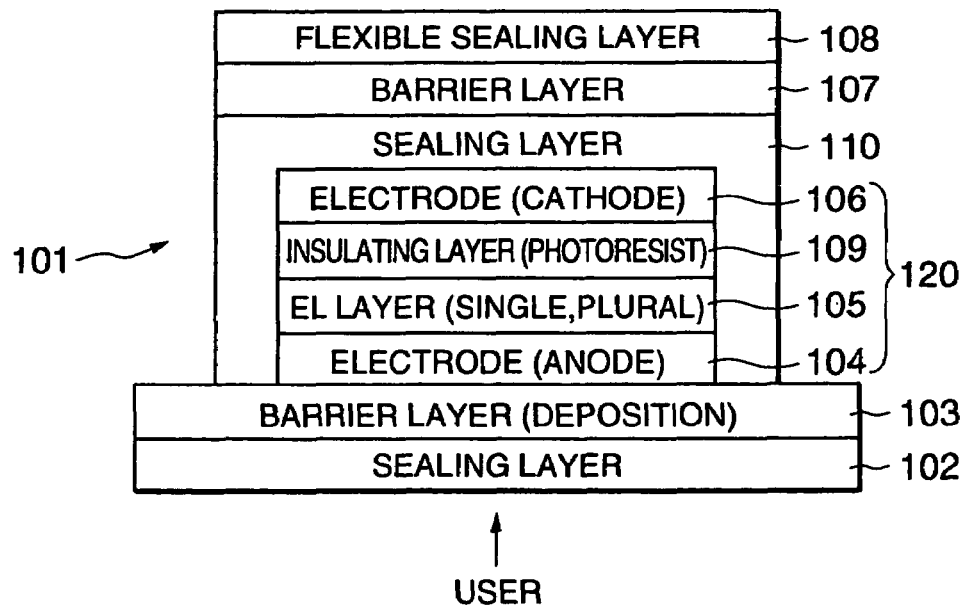
FIG. 5 is a cross-sectional view showing another example of a structure of a light emitting display panel according to the present invention.
Figure 6A:
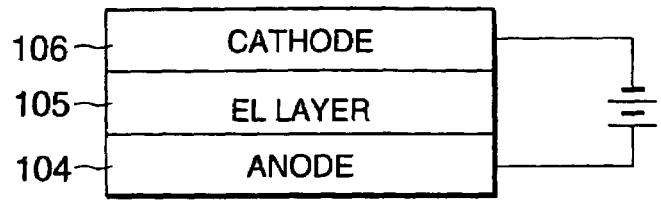
FIGS. 6A to 6D are cross-sectional views showing examples of a structure of an EL layer of a light emitting display panel according to the present invention.
Figure 6B:
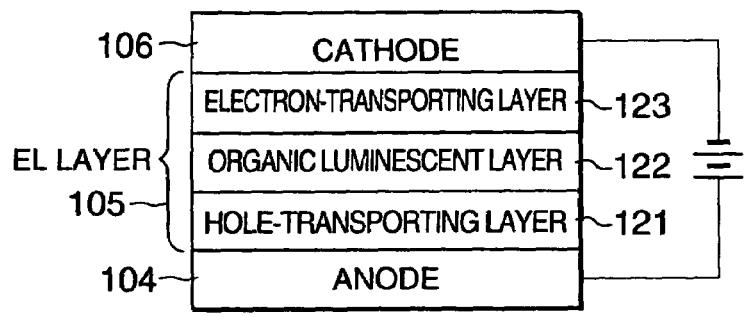
Figure 6C:
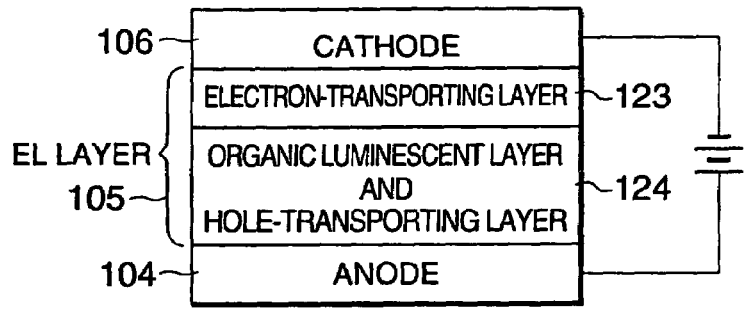
Figure 6D:
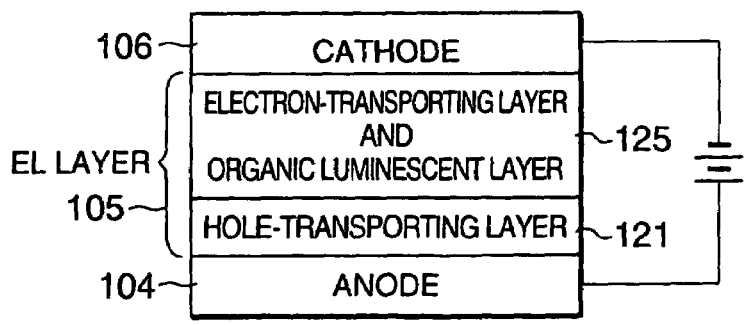

Next, embodiments of light emitting display panel according to the present invention are hereinafter described in detail. FIG. 4 shows an example of a structure of a light emitting display panel according to the present invention. FIG. 5 shows another example of a structure of a light emitting display panel according to the present invention.

As shown in FIGS. 4 and 5, each light emitting display panel according to the present invention includes a layered body 101 having at least a flexible base layer 102, a first electrode layer 104, an EL layer 105, a second electrode layer 106, and a flexible sealing layer 108, which are superposed in that order. As a characteristic feature, an insulating layer 109 that insulates the first electrode layer 104 and the second electrode layer 106 to each other is formed into a predetermined pattern in the layered body 101. In FIG. 4, the insulating layer 109 is formed between the first electrode layer 104 and the EL layer 105. In FIG. 5, the insulating layer 109 is formed between the EL layer 105 and the second electrode layer 106. Barrier layers 103 and 107 in FIGS. 4 and 5 are preferably provided in order to improve a barrier property of the flexible base layer 102 and the flexible sealing layer 108.

(Flexible Base Layer 102)

The flexible base layer 102 is arranged on a side of users (observers). Thus, the flexible base layer 102 has to be transparent as much as the users can easily recognize a character, a figure, a mark or a display pattern formed by combining some of a character, a figure and a mark, which is formed by luminescence of the EL layer 105.

The flexible base layer 102 is a resin film or a sheet formed by applying a protective plastic sheet or a protective plastic layer to a thin sheet glass of a thickness not greater than about 100 μm. The flexible base layer 102, which is highly flexible and can be rolled and curved, is a preferable base layer for a light emitting display panel to be attached to or incorporated in various objects.

There is no particular restriction on the material of the flexible base layer 102, provided that the flexible base layer 102 has a sufficient flexibility required of a base layer for a light emitting display panel. More concretely, materials suitable for forming the flexible base layer 102 include, fluorine resins, polyethylene resins, polypropylene resins, polyvinyl chloride resins, polyvinyl fluoride resins, polystyrene resins, ABS resins, polyamide resins, polyacetal resins, polyester resins, polycarbonate resins, modified poly(phenylene ether) resins, polysulfone resins, polyarylate resins, poly(ether imide) resins, polyamidimde resins, polyimide resins, polyphenylene sulfide resins, liquid crystalline polyester resins, polyethylene terephthalate resins, polybutylene terephthalate resins, polyethylene naphthalate resins, polyoxymethylene resins, poly(ether sulphone) resins, poly(ether ether ketone) resins, polyacrylate resins, polyacrylonitrile-styrene resins, phenolic resins, urea resins, melamine resins, unsaturated polyester resins, epoxy resins, polyurethane resins, silicone resins and amorphous polyolefin resins. The flexible base layer 102 may be formed of any suitable polymer, other than the foregoing resins, meeting conditions required of materials for forming a light emitting display panel. The flexible base layer 102 may be formed of a copolymer produced through copolymerization of some of the starting materials, i.e. monomers, of the foregoing resins.

More preferably, the flexible base layer 102 is formed of a resin satisfactory in solvent resistance and heat resistance and, if the purpose requires, having a gas-barrier property capable of preventing penetration of steam and oxygen gas. When a resin material having the gas-barrier property is used, a barrier layer 3, which will be described later, may be omitted. However, it is preferable that a light emitting display panel of the present invention is provided with both the flexible base layer 102 and the barrier layer 103. Preferably, the flexible base layer 102 is formed by an extrusion process or the like into a film of a thickness in the range of 50 to 200 μm.

A sheet, as the flexible base layer 102, formed by applying a protective plastic sheet or a protective plastic layer to a thin sheet glass of a thickness not greater than about 100 μm is excellent in flexibility, can be rolled or curved, and hence is a preferable flexible base layer 102. Preferably, the protective plastic sheet or the protective plastic layer has a satisfactory gas-barrier property.

When the flexible base layer 102 has a thickness in the above range, the flexible base layer 102 can provide a suitable flexibility for a light emitting display panel. Such a flexible light emitting display panel can be arranged with a complicated shape.

In addition, the light emitting display panel can be made as thin as 50 μm to 400 μm. Thus, the light emitting display panel can be used as a display element for a portable apparatus. In addition, the light emitting display panel can be used for an advertisement medium that can be freely rolled and/or curved.

(Barrier Layer 103)

The barrier layer 103 is not an essential layer in a light emitting display panel of the present invention. However, it is preferable to sandwich the barrier layer 103 between the flexible base layer 102 and the first electrode layer 104. The barrier layer 103 prevents penetration of moisture (steam) and oxygen gas, which affects adversely to the life and luminescent ability of the organic EL layer 105, into the organic EL layer 105. The barrier layer 103, similarly to the flexible base layer 102, must be transparent.

Preferably, the barrier layer 103 is an inorganic oxide thin film. Inorganic oxides suitable for forming the barrier layer 103 include, for example, silicon dioxide, aluminum oxide, titanium oxide, yttrium oxide, germanium oxide, zinc oxide, magnesium oxide, calcium oxide, boron oxide, strontium oxide, barium oxide, lead oxide, zirconium oxide, sodium oxide, lithium oxide and potassium oxide. The barrier layer 103 may be formed of one or some of those oxides. Silicon dioxide, aluminum oxide and titanium oxide are particularly preferable materials for forming the barrier layer 103. The barrier layer 103 may be also formed of a material other than an inorganic oxide, such as silicon nitride. Preferably, the thickness of the barrier layer 103 is in the range of 0.01 to 0.5 μm.

The barrier layer 103 is formed between the flexible base layer 102 and the first electrode layer 104, for example, on the flexible base layer 102 by a physical vapor deposition process, such as a reactive sputtering process or a vacuum evaporation process. The barrier layer 103 can be formed by a physical deposition system that conveys the film-like flexible base layer 102 according to a roll-to-roll method.

(First and Second Electrode Layers 104, 106)

The first electrode layer 104 and the second electrode layer 106 are essential layers to apply an electric field to the EL layer 105. The first electrode layer 104 is on the side of the flexible layer 102 with respect to the EL layer 105, and the second electrode layer 106 is on the side of the flexible sealing layer 108 with respect to the EL layer 105. At least one of the first electrode layer 104 and the second electrode layer 106 must be transparent. Preferably, at least the first electrode layer 104 facing the users (observers), similarly to the flexible base layer 102 and the barrier layer 103, must be transparent. The second electrode layer 106 does not necessarily need to be transparent. However, the second electrode layer 106 also needs to be transparent if a display pattern such as a character should be seen on the opposite back side too.

Suitable materials for forming the first electrode layer 104 include, for example, indium tin oxide (ITO), indium oxide, indium zinc oxide (IZO), gold and polyaniline. Indium tin oxide and indium zinc oxide, which are transparent oxides, are particularly preferable.

Suitable materials for forming the second electrode layer 106 include, in addition to indium tin oxide (ITO), indium oxide, indium zinc oxide (IZO), gold and polyaniline, magnesium alloys, such as Mg/Ag alloys, aluminum alloys, such as Al/Li alloys, Al/Ca alloys and Al/Mg alloys, and metallic calcium. If the second electrode layer 106 must be transparent, the second electrode layer 106 may be formed as a transparent electrode layer, similarly to the first electrode layer 104.

Any one of the first electrode layer 104 and the second electrode layer 106 may be an anode layer or a cathode layer. However, if one electrode layer is formed as an anode layer, the electrode layer is preferably formed of an electrical conductive material whose work function is large (for example, indium tin oxide (ITO)), in order to facilitate hole-injection. On the other hand, if one electrode layer is formed as a cathode layer, the electrode layer is preferably formed of an electrical conductive material whose work function is small (for example, metallic calcium), in order to facilitate electron-injection.

Preferably, the respective thicknesses of the first electrode layer 104 and the second electrode layer 106 are 0.005 μm to 0.5 μm. Usually, the first electrode layer 104 and the second electrode layer 106 are formed contiguously with the EL layer 105 by a sputtering process or a vacuum evaporation process.

The first electrode layer 104 and the second electrode layer 106 may be either solid layers or patterned layers pattered so as to correspond to the EL layer 105. A patterned electrode layer is formed by subjecting a solid electrode layer to an etching process using a photoresist mask.

(EL Layer 105)

The EL layer 105 is indispensable in a light emitting display panel. Various types of the EL layer 105 are shown in FIGS. 6A to 6D.

The EL layer 105 may be of generally known construction. For example, the EL layer 105 may be: an organic luminescent layer containing an organic luminescent substance, such as an organic fluorescent substance, and being formed between electrode layers (see FIG. 6A); a layered structure consisting of an organic luminescent layer 122, a hole-transporting layer 121 of a hole-transporting material formed on a surface of the organic luminescent layer 122 on the side of an anode, and an electron-transporting layer 123 of an electron-transporting material formed on the other surface of the organic luminescent layer 122 on the side of a cathode (see FIG. 6B); a layered structure consisting of an organic luminescent layer 124 having the property of a hole-transporting layer, and an electron-transporting layer 123 formed on a surface of the organic luminescent layer 124 on the side of a cathode (see FIG. 6C); or a layered structure consisting of an organic luminescent layer 125 having the property of an electron-transporting layer, and a hole-transporting layer 121 formed on a surface of the organic luminescent layer 125 on the side of anode (see FIG. 6D).

In addition, the EL layer 105 may be: a layered structure consisting of a mixed layer of a hole-transporting material and an organic luminescent substance, which has been formed at least by mixing a hole-transporting material and an organic luminescent substance, and an electron-transporting layer; a layered structure consisting of a mixed layer of an organic luminescent substance and an electron-transporting material, which has been formed at least by mixing an organic luminescent substance and an electron-transporting material, and a hole-transporting layer; or a mixed layer of a hole-transporting material, an organic luminescent substance and an electron-transporting material.

The organic luminescent layer containing an organic luminescent substance may be formed of an azo compound generally used for forming an organic EL layer. The organic luminescent layer may be also formed of an azo compound containing an organic luminescent substance. Suitable organic luminescent substances include pyrene, anthracene, naphthacene, phenanthrene, coronene, chrysene, fluorene, perylene, perynone, diphenylbutadiene, coumarin, styryl, pyrazine, aminoquinoline, imine, diphenylethylene, merocyanine, quinacridone, rubrene and derivatives of those substances. An organic luminescent layer is formed by using an organic luminescent layer forming liquid containing such a compound.

The hole-transporting material may be chosen from generally used hole-transporting materials including phthalocyanine, naphthalocyanine, polyphylene, oxadiazole, triphenylamine, triazole, imidazole, imidazolone, tetrahydroimiazole, hydrazone, stilbene, butadiene and derivatives of those substances. The hole-transporting material may be a hole-transporting layer forming composition on the market, such as poly(3, 4)ethylene dioxithiophene/polystyrenesulfonate (abbreviated to PEDOT/PSS), such as Baytron P AI4083 commercially available in an aqueous solution from Bayer. The hole-transporting layer is formed by using a hole-transporting layer forming liquid containing such a compound.

Suitable electron-transporting materials include anthraquinodimethane, fluorenylidenemethane, tetracyanoethylene, fluorenone, diphenoquinone oxadiazole, anthrone, thiopyran dioxide, diphenoquinone, benzoquinone, malononitrile, dinitrobenzene, nitroanthraquinone, maleic anhydride, perylene tetracarboxylic acid and derivatives of those substances. The electron-transporting layer is formed by using an electron-transporting layer forming liquid containing such a substance.

The EL layer may be formed, for example correspondingly to the layered structures shown in FIGS. 6A to 6D, by pouring an organic luminescent layer forming liquid, a hole-transporting layer forming liquid and an electron-transporting layer forming liquid in predetermined spaces demarcated by partition walls. Those liquids may be poured by a dispenser process using a dispenser for dropping a liquid, an ink-jet process, a spin-coating process or a printing process. Preferably, the EL layer is formed by a printing process, such as a gravure printing process, a gravure-offset printing process or an ink-jet printing process, under roll-to-roll manufacturing conditions. The ink-jet printing method is particularly preferable for printing a pattern because: the ink-jet printing method is able to apply the liquid to a base without touching and damaging the base; does not need any printing plate; and hence has a high degree of freedom. The productivity of forming the EL layer can be more improved by forming that by one of those printing processes. The poured liquids are subjected to a heat treatment, such as a vacuum heat treatment. Preferably, the thickness of the EL layer 105 in the above-mentioned layered structures is in the range of 0.1 to 2.5 µm.

The partition walls, not shown, demarcate regions that become luminous in different colors on the surface of the light emitting display panel. A hole-transporting layer forming liquid, an organic luminescent layer forming liquid, and an electron-transporting layer forming liquid are respectively poured into the regions demarcated by the partition walls, according to the above-mentioned layered structure forming mode. The partition walls may be formed of a generally used partition wall forming material, such as a photopolymer, a curable resin that can be cured by radiation having activation energy, a thermosetting resin or a thermoplastic resin. The partition walls may be formed by a method suitable for forming the partition walls with a selected material. For example, the partition walls may be formed by a thick-film printing process or a patterning process using a photoresist mask.

(Sealing Layer 110)

The sealing layer 110 is flexible. The sealing layer 110 is preferably provided in order to fill (eliminate) and seal gaps between an organic EL element 120 including the EL layer and the flexible sealing element 108. The sealing layer 110 is formed of a generally used sealing material. Preferably, the sealing layer 110 is formed of a thermosetting epoxy adhesive or a UV-curable acrylic adhesive.

The sealing layer 110 has a barrier property when formed of a material having a barrier property. Therefore, the barrier layer 107 and the flexible sealing layer 108 may be omitted, so that only the sealing layer 110 may be formed on the back side, i.e., the side away from the users with respect to the EL element 120.

The sealing layer 110 may be directly formed on the organic EL element 120 so as to entirely coat a surface of the organic EL element 120, or may be formed on the flexible sealing layer 108 and then applied to the organic EL element 120. Preferably, the sealing layer 110 is formed in the least possible thickness provided that the sealing layer 110 is able to seal the gaps. The thickness of the sealing layer 110 may properly be adjusted. The sealing layer 110 is hardened under thermosetting or curing conditions depending on the material of the sealing layer 110.

Preferably, the sealing layer 110 entirely coats the surface of the EL element 120. If a sealing layer is formed on a glass substrate by a conventional frame-like application process, a middle part of the sealing layer may touch the EL element when a panel is curved even after applying the sealing layer to the glass substrate. Such a trouble can be prevented by forming the sealing layer 110 over the entire surface of the EL element 120. Thus, the organic EL display panel provided with the sealing layer coating the entire surface of the EL element does not have any gaps therein. Therefore, the organic EL display panel will not be unnecessarily strained and tensioned even when rolled or curved, and hence troubles including abnormal contact in the EL element can be suppressed. In addition, if the sealing layer itself has a barrier property, the sealing layer entirely coating the surface of the EL element improves the sealing effect to suppress the penetration of moisture and gases into the EL element, which improves the protecting effect for the EL element.

(Barrier Layer 107)

The barrier layer 107 is not essential. However, as shown in FIGS. 4 and 5, the barrier layer 107 is preferably formed on the side of the EL layer 105 with respect to the flexible sealing layer 108. The barrier layer 107 is formed between the flexible sealing layer 108 and the second electrode layer 106, more concretely, between the flexible sealing layer 108 and the sealing layer 110. The operation and effect of the barrier layer 107 are the same as those of the barrier layer 103. Although there is no particular restriction on the material of the barrier layer 107, it is preferable to form the barrier layers 103 and 107 of the same material.

The barrier layer 107 is formed on the flexible sealing layer 108 by a physical deposition process, such as a reactive sputtering process or a vacuum deposition process. The barrier layer 107 is formed by a physical vapor deposition system that conveys the flexible sealing layer 108, which has the shape of a film, according to a roll-to-roll method.

(Flexible Sealing Layer 108)

As shown in FIGS. 4 and 5, the flexible sealing layer 108 is a posterior layer opposite the anterior layer facing the users. When the light emitting display panel is to be seen only on the anterior side, the flexible sealing layer 108 does not need to be transparent. However, when the light emitting display panel is to be seen on both sides, it is preferable that the flexible sealing layer 108 is transparent. If the flexible sealing layer 108 is transparent, the users can visually recognize a display pattern such as a character on the back side too.

The flexible sealing layer 108 is a flexible resin film capable of being rolled or curved. Therefore, the flexible sealing layer 108 is preferably used as a base layer for a light emitting display panel that can be attached to various structures. The material of the flexible sealing layer 108 and the method for forming the same are the same as those mentioned in connection with the flexible base layer 102, and hence the description thereof will be omitted. Preferably, the thickness of the flexible sealing layer 108, similarly to that of the flexible base layer 102, is in the range of 50 to 200 µm. The flexible sealing layer 108 of such a thickness has flexibility suitable for the light emitting display panel.

(Insulating Layer 109)

The insulating layer 109 is a feature of the light emitting display panel of the present invention. The insulating layer 109 is formed in a predetermined pattern between the first electrode layer 104 and the second electrode layer 106, and defines a light emitting region of a predetermined shape. The light emitting region may form a character, a figure, a mark or a display pattern formed by combining some of a character, a figure and a mark. Alternatively, a light non-emitting region other than the light emitting region may form a character, a figure, a mark or a display pattern formed by combining some of a character, a figure and a mark.

That is, since the insulating layer 109 blocks the voltage applied between the electrode layers 104 and 106, the region defined by the insulating layer 109 in the EL layer 105 does not emit light. That is, the region corresponding to the patterned insulating layer 109 is a nonluminous region, which defines a or more luminous regions for display. On the other hand, in the luminous regions not corresponding to the patterned insulating layer 109, since the electrodes 104 and 106 are contiguous with the opposite surfaces of the EL layer 105, the voltage is applied between the luminous regions of the EL layer 105 to exert the soliciting effects.

The light emitting region or the light non-emitting region defined by the insulating layer 109 is preferably a character, a figure, a mark or a display pattern formed by combining some of a character, a figure and a mark. In such a case, the character, the figure, the mark or the display pattern can be displayed with a superior soliciting effect.

Figure 7:
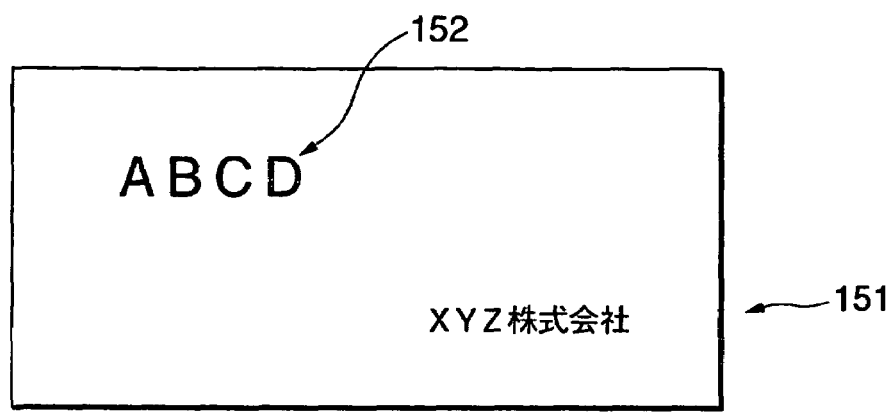
FIG. 7 is a plan view showing an example of a light emitting display panel according to the present invention, wherein a light emitting region includes characters.
Figure 8:
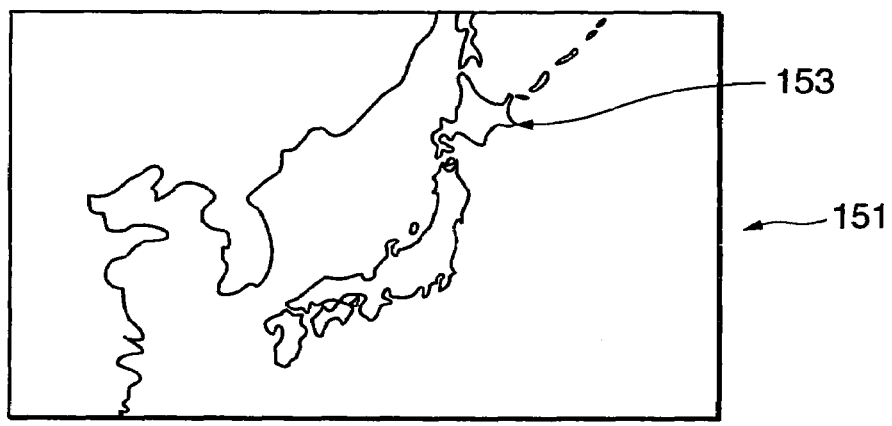
FIG. 8 is a plan view showing another example of a light emitting display panel according to the present invention, wherein a light emitting region includes a figure.
Figure 9:
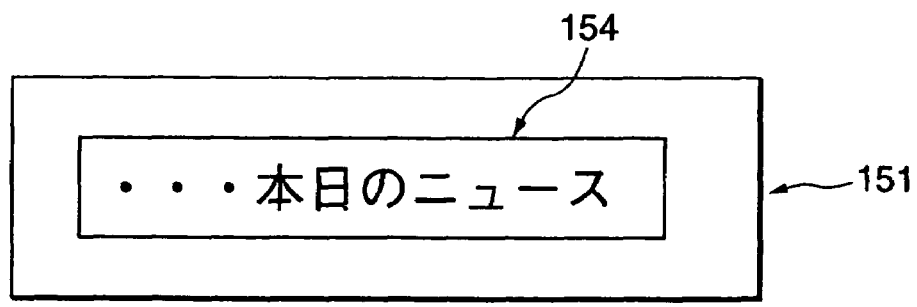
FIG. 9 is a plan view showing another example of a light emitting display panel according to the present invention, wherein a light emitting region includes an entire screen.

As shown in FIGS. 7 to 9, the display pattern may be various. The light emitting display panel 151 shown in FIG. 7 has a display pattern of characters 152, which may be defined by light emitting regions or light non-emitting regions. The light emitting display panel 151 shown in FIG. 8 has a display pattern of a FIG. 153, which may be defined by light emitting regions or light non-emitting regions. The light emitting display panel 151 shown in FIG. 9 has a display pattern of an entire screen 154, which is a light emitting region.

Such a display pattern may be a pattern consisting of several sections as shown in FIGS. 7 and 8 or may be a simple outlined pattern as shown in FIG. 9. In addition, the insulating layer 109 may be a dot layer formed of dots.

In a case as shown in FIG. 9, in order to show a character as if it moves in a fixed direction, the insulating layer may be formed in a simple outlined pattern, the EL layer may be divided into a dot matrix pattern, and each element of the dot matrix pattern may be individually controlled to be luminous.

The insulating layer 109 may be laminated to either the first electrode layer 104 or the second electrode layer 106. Usually, a resist material for forming the insulating layer is transparent, and hence a patterned insulating layer (resist layer) is also hardly visible. Therefore, the insulating layer scarcely affects the visibility of the light emitting display panel.

A display pattern formed by an insulative layer is hereinafter described in detail. A preferable material employed for forming an insulative layer 109 is a photosensitive resin composition which is used as a resist material. The photosensitive resin composition may be either a positive type photosensitive resin composition or a negative type photosensitive resin composition. As a positive type photosensitive resin composition, a composition mainly formed of a quinonediazide photosensitive resin of a photolytic soluble type may be taken for instance. As a negative type photosensitive resin composition, a composition formed of: an azide photosensitive resin of a photolytic cross-linking type, a diazo photosensitive resin of a photolytic insoluble type, a cinnamate photosensitive resin of a photo-dimerization type, an unsaturated polyester photosensitive resin of a photo-polymerization type, an acrylate resin of a photo-polymerization type, or a cationic polymerized resin, may be taken for instance. A photo-polymerization initiator, a sensitizing pigment and so on may be mixed to these photosensitive resin compositions if necessary.

The insulative layer 109 is formed by applying the above-described photosensitive resin composition to the whole surface of any one of the electrode layers, and carrying out a pattern exposure and a development so as to form a predetermined pattern. Specifically, the above-described photosensitive resin composition is firstly formed on the whole surface of an electrode layer by a spin coating method. Then, the photosensitive resin composition is exposed with a mask pattern. The exposure is carried out by using a light source such as an ultra-high-pressure mercury lamp, a high-pressure mercury lamp, a carbon arc lamp, a xenon arc lamp, or a metal halide lamp, in such a manner that an ultraviolet irradiation of 0.1 to 10,000 mJ/cm$^2$, preferably 10 to 1,000 mJ/cm$^2$, is achieved.

When a positive type photosensitive resin composition is used, an exposed part becomes soluble so that the exposed part is dissolved and eliminated by a development. Thus, an unexposed part remains as an insulative layer of a predetermined pattern. On the other hand, when a negative type photosensitive resin composition is used, an exposed part becomes insoluble so that an unexposed part is dissolved and eliminated by a development. Thus, the exposed part remains as an insulative layer of a predetermined pattern. Although a thickness of the insulative layer may be optionally adjusted according to an insulative resistance peculiar to a resin forming the insulative layer, it is generally in a range of 0.5 to 3.0 μm.

(Light Emitting Display Panel)

A basic layered structure of a light emitting display panel according to the present invention is described above. However, a functional layer other than the above-described layers may be added unless the objects and effects of the present invention are not impaired. Such a functional layer may be a low refractive index layer, a reflecting layer, or a light absorbing layer, which are used in a general organic EL element or a general light emitting display panel.

In order that a light emitting display panel according to the present invention has a total thickness of not more than 400 μm, preferably 50 μm to 200 μm, thicknesses of the above-described layers are preferably adjusted. A light emitting display panel having a thickness within the range is so flexible that it can be rounded and bent. When used as an electric spectacular panel, the light emitting display panel can be set up in a complicated configuration. A light emitting display panel having a thickness of more than 400 μm may somewhat be disadvantageous in its flexibility. On the contrary, a light emitting display panel having a thickness of less than 50 μm has a low barrier property and is thus vulnerable to heat and stress applied thereto during the processes.

In a light emitting display panel according to the present invention, a partial layered structure, on one side of the EL layer 105, which is formed of at least a flexible base layer and a first electrode layer, and a partial layered structure, on the other side of the EL layer 105, which is formed of at least a second electrode layer and a flexible sealing layer preferably have preferably the same or similar expansion coefficient. In the case, even when there is an external factor such as heat in the course of manufacturing a light emitting display panel, it is unlikely that the light emitting display panel is adversely affected such as deformed. That is, with respect to the partial layered structure on one side of the EL layer 105 and the partial layered structure on the other side thereof, the number of layers, the respective materials for the layers, and the thicknesses of the layers are the same or similar, thus even if deformations are generated on the both sides of the EL layer 105 by the external factor such as heat during the manufacturing step, they can be balanced. As a result, a harmful effect such as deformation of a light emitting display panel can be restrained.

In fabricating the light emitting display panel, the component layers of the light emitting display panel can continuously be formed by wet processes. Therefore, the light emitting display panel can be placed on the market at a reasonable price. For example, (1) the flexible base layer 102 provided with the barrier layer 103, and the flexible sealing layer 108 provided with the barrier layer 107 are formed by a continuous vapor deposition process, (2) the first electrode layer 104 is formed by a sputtering process on the barrier layer 103 formed on the flexible base layer 102, (3) the EL layer 105 is formed by a printing process on the first electrode layer 104, (4) the second electrode layer 106 is formed by a vacuum evaporation process on the EL layer 105, (5) the sealing layer 110 is formed by applying a sealing agent to the second electrode layer 106, and (6) the flexible sealing layer 108 provided with the barrier layer 107 is bonded to the sealing layer 110. Thus, the light emitting display panel can be efficiently manufactured by using wet processes in many steps in accordance with a roll-to-roll continuous manufacturing method, which is superior in productivity.

EXAMPLE

An example of a light emitting display panel according to the present invention will be described.

A 100 µm thick flexible base layer 102 of a poly(ether sulphone) resin was formed by an extrusion process. A 0.1 µm thick barrier layer 103 of SiON was formed by a continuous vapor deposition system on the flexible base layer 102. A 0.1 µm thick anode layer of ITO was formed by a sputtering process on the barrier layer 103. A 1 µm thick insulating layer of a photoresist was formed by a spin-coating process on the anode layer. The insulating layer was patterned by photolithography, that is, the insulating layer was exposed to an exposure source through a mask of a predetermined pattern and the exposed insulating layer was developed. Thus, a patterned insulating layer having a patterning of letters as shown in FIG. 7 is completed. A 150 nm thick EL layer 105 of a mixture of a hole-transporting material and an organic luminescent material was formed by a printing process over the anode layer covered with the patterned insulating layer. A cathode layer consisting of a 0.008 µm thick metallic calcium layer and a 0.5 µm thick silver layer was formed by a vacuum deposition process on the EL layer 105. An about 150 µm thick sealing layer of a two-part thermosetting epoxy resin adhesive was formed by a screen-printing process over the cathode layer. A flexible sealing layer provided with a barrier layer was bonded to the sealing layer. The flexible sealing layer provided with the barrier layer was formed by forming a 0.1 µm thick barrier layer 103 of SiON by a continuous evaporation system on a 100 µm thick flexible sealing layer of a poly(ether sulphone) resin formed by an extrusion process. Thus, a light emitting display panel was fabricated by a fabricating method including those wet processes.

As apparent from the foregoing description, the light emitting display panel of the present invention is superior in a soliciting effect, environmental resistance and flexibility. Furthermore, the light emitting display panel of the present invention is suitable for being manufactured at a low cost.

What is claimed is:

1. A method of manufacturing a light emitting display panel, comprising:
    laminating at least a flexible base layer, a first electrode layer, an EL layer, a second electrode layer and a flexible sealing layer in order;
    wherein:
    the flexible base layer is attached to a rigid flat plate during lamination of one or more of the first electrode layer, the EL layer, the second electrode layer and the flexible sealing layer to the flexible base layer;
    the flexible base layer is removed from the rigid flat plate prior to completion of the method; and
    the flexible base layer comprises a laminate of a thin glass sheet and a preformed protective plastic sheet, and has sufficient flexibility to be freely rolled and/or curved.

2. The method of manufacturing a light emitting display panel according to claim 1, wherein the EL layer is formed on the flexible substrate while the flexible substrate is attached to the rigid flat plate.

3. The method of manufacturing a light emitting display panel according to claim 1, wherein the flexible base layer is attached to and removed from the rigid flat plate at least twice before the method is complete.

4. The method of manufacturing a light emitting display panel according to claim 1, wherein the flexible base layer is attached to the rigid flat plate by at least one method selected from the group consisting of detachable sealing attachment, bond attachment, adhesive attachment, attachment by tool, and vacuum attachment.

5. The method of manufacturing a light emitting display panel according to claim 1, wherein the rigid flat plate is a glass substrate.

6. The method of manufacturing a light emitting display panel according to claim 1, wherein:
    the laminated structure comprises an insulating layer that insulates the first electrode layer and the second electrode layer from each other; and
    the insulating layer is formed in a predetermined pattern.

* * * * *